United States Patent
Nath et al.

(10) Patent No.: US 12,408,366 B2
(45) Date of Patent: Sep. 2, 2025

(54) PROTECTION DEVICE STRUCTURES WITH A DISCONTINUOUS ISOLATION WELL

(71) Applicant: GlobalFoundries U.S. Inc., Malta, NY (US)

(72) Inventors: Anindya Nath, Essex Junction, VT (US); Alain Loiseau, Williston, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 568 days.

(21) Appl. No.: 17/831,496

(22) Filed: Jun. 3, 2022

(65) Prior Publication Data

US 2023/0395714 A1    Dec. 7, 2023

(51) Int. Cl.
*H10D 62/17*     (2025.01)
*H10D 30/01*     (2025.01)
*H10D 30/60*     (2025.01)
*H10D 84/01*     (2025.01)
*H10D 84/03*     (2025.01)
*H10D 89/60*     (2025.01)

(52) U.S. Cl.
CPC ........ *H10D 30/603* (2025.01); *H10D 30/0221* (2025.01); *H10D 84/0191* (2025.01); *H10D 84/038* (2025.01)

(58) Field of Classification Search
CPC ........ H01L 29/7835; H01L 21/823892; H10D 30/603; H10D 30/0221; H10D 30/60; H10D 84/0191; H10D 84/038
See application file for complete search history.

(56) References Cited

U.S. PATENT DOCUMENTS

| | | | |
|---|---|---|---|
| 6,677,210 B1 * | 1/2004 | Hebert | H10D 30/0221 |
| | | | 257/E29.136 |
| 2008/0203480 A1 | 8/2008 | Stiftinger et al. | |
| 2010/0019318 A1 * | 1/2010 | Chao | H01L 29/0847 |
| | | | 257/E27.06 |
| 2018/0082994 A1 * | 3/2018 | Han | H01L 27/0274 |
| 2020/0066837 A1 * | 2/2020 | Karp | H01L 29/0619 |
| 2022/0254772 A1 * | 8/2022 | Chen | H01L 27/0262 |

OTHER PUBLICATIONS

Z. Liu, J. J. Liou and J. Vinson, "Novel Silicon-Controlled Rectifier (SCR) for High-Voltage Electrostatic Discharge (ESD) Applications," in IEEE Electron Device Letters, vol. 29, No. 7, pp. 753-755, doi: 10.1109/LED.2008.923711 (Jul. 2008).

(Continued)

*Primary Examiner* — Joshua Benitez Rosario
*Assistant Examiner* — Jacob T Nelson
(74) *Attorney, Agent, or Firm* — Thompson Hine LLP; Francois Pagette

(57) ABSTRACT

Device structures with an isolation well and methods of forming a device structure with an isolation well. The structure comprises a first well of a first conductivity type in a semiconductor substrate, and a second well of a second conductivity type in the semiconductor substrate. The second conductivity type is opposite to the first conductivity type. The first well includes a plurality of segments, and the second well is positioned in a vertical direction between the segments of the first well and a top surface of the semiconductor substrate.

15 Claims, 5 Drawing Sheets

(56) References Cited

OTHER PUBLICATIONS

Shengdong Zhang, J. K. O. Sin, T. M. L. Lai and P. K. Ko, "Numerical modeling of linear doping profiles for high-voltage thin-film SOI devices," in IEEE Transactions on Electron Devices, vol. 46, No. 5, pp. 1036-1041, doi: 10.1109/16.760414 (May 1999).
W. Zhang et al., "A Novel High Voltage Ultra-Thin SOI-LDMOS With Sectional Linearly Doped Drift Region," in IEEE Electron Device Letters, vol. 40, No. 7, pp. 1151-1154, doi: 10.1109/LED. 2019.2919074 (Jul. 2019).

* cited by examiner

PROTECTION DEVICE STRUCTURES WITH A DISCONTINUOUS ISOLATION WELL

BACKGROUND

The disclosure relates generally to semiconductor devices and integrated circuit fabrication and, more specifically, to device structures with an isolation well and methods of forming a device structure with an isolation well.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed to the integrated circuit. An ESD event may occur during post-manufacture chip handling or after chip installation on a circuit board or other carrier. The high current may originate from a variety of sources, such as the human body, a machine component, or a chip carrier.

Precautions may be taken to protect the integrated circuit from an ESD event. One such precaution is to incorporate an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and shunts the ESD current away from the integrated circuit. The protection device remains clamped in its low-impedance state until the ESD current is drained and the ESD voltage is discharged to an acceptable level.

A common type of protection device commonly deployed in an ESD protection circuit is a silicon-controlled rectifier (SCR). In its quiescent state, the SCR restricts current conduction to leakage current. However, a voltage pulse exceeding an engineered threshold, known as the trigger voltage, initiates the conduction of a forward current between the anode and cathode of the SCR. Even after the trigger voltage is removed, the SCR remains clamped to conduct the forward current so long as the forward current remains above an engineered holding current. When the forward current from the ESD event drops below the holding current, the SCR returns to its quiescent state.

The protection device may be formed with a triple-well layer that is used to electrically isolate the device well from the substrate. In a triple-well technology, the addition of a high-energy implant to the process flow allows for the creation of a separate continuous tub of doped semiconductor material that is junction isolated from the substrate.

Improved device structures with an isolation well and methods of forming a device structure with an isolation well are needed.

SUMMARY

In an embodiment, a structure comprises a semiconductor substrate having a top surface, a first well of a first conductivity type in the semiconductor substrate, and a second well of a second conductivity type in the semiconductor substrate. The second conductivity type is opposite to the first conductivity type. The first well includes a plurality of segments, and the second well is positioned in a vertical direction between the segments of the first well and the top surface of the semiconductor substrate.

In an embodiment, a method comprises forming a first well of a first conductivity type in a semiconductor substrate, and forming a second well of a second conductivity type in the semiconductor substrate. The second conductivity type is opposite to the first conductivity type. The first well includes a plurality of segments, and the second well is positioned in a vertical direction between the segments of the first well and a top surface of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
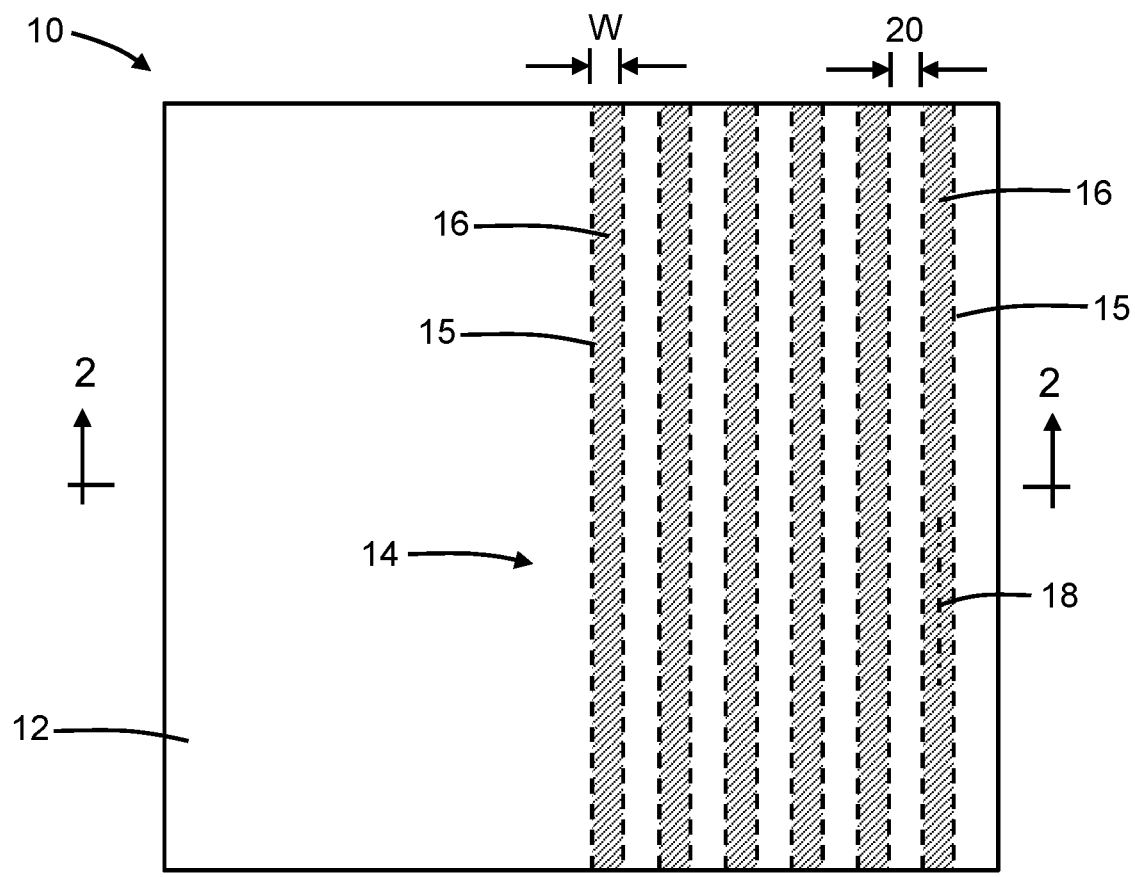
FIG. 1 is a top view of a structure in accordance with embodiments of the invention.

With reference to FIG. 1 and in accordance with embodiments of the invention, a structure 10 for a silicon-controlled rectifier includes a semiconductor substrate 12 that may be comprised of a semiconductor material, such as single-crystal silicon. In an embodiment, the semiconductor substrate 12 may be doped to have p-type conductivity. The semiconductor substrate 12 has a top surface 11 and a bottom surface opposite to the top surface 11 in a vertical direction.

The structure 10 includes a segmented deep well 14 that is formed in the semiconductor substrate 12 over a given depth range beneath the top surface 11. The deep well 14 includes segments 16 that are doped to have an opposite conductivity type from the semiconductor substrate 12. The deep well 14 may be formed by introducing a dopant by, for example, ion implantation of the semiconductor substrate 12. A patterned implantation mask may be formed to define selected areas on the top surface 11 of the semiconductor substrate 12 that are exposed for implantation of ions to form the segments 16. The implantation mask may include a layer of an organic photoresist that is applied and patterned to form openings exposing the selected areas on the top surface 11 of the semiconductor substrate 12 and determining, at least in part, the location and horizontal dimensions of the segments 16. The implantation mask has a thickness and stopping power sufficient to block the implantation of ions in masked areas. Implantation conditions (e.g., ion species, dose, kinetic energy) may be selected to tune the electrical and physical characteristics of the deep well 14. In an embodiment, the deep well 14 may be doped with a concentration of an n-type dopant (e.g., arsenic or phosphorus) to provide n-type conductivity. In an embodiment, the deep well 14 may contain an n-type dopant concentration in a range of about $5\times10^{15}$ cm$^{-3}$ to about $5\times10^{16}$ cm$^{-3}$.

The segments 16 of the deep well 14 are discontinuous (i.e., non-continuous) in that only discrete regions of the semiconductor substrate 12 are doped. The deep well 14 is marked by breaks or interruptions defined by distinct and unconnected doped regions having the form of the segments 16. The segments 16 are buried beneath the top surface 11 of the semiconductor substrate 12 in that an unimplanted thickness of the semiconductor substrate 12 separates the segments 16 from the top surface 11.

In the representative embodiment, each segment 16 may be a strip that is aligned along a longitudinal axis 18 and that has a width W in a direction transverse to the longitudinal axis 18. In an embodiment, the longitudinal axes 18 of the different segments 16 may have a parallel alignment. The segments 16 have opposite side edges 15, and the side edges 15 of adjacent pairs of the segments 16 are separated by a gap 20. The segments 16, which have a side-by-side arrangement, are islands of doped semiconductor material that are not connected to each other. In that regard, strips of the oppositely-doped semiconductor substrate 12 are disposed in the gaps 20 between adjacent segments 16 such that the strips provided by the segments 16 and the strips provided by the semiconductor substrate 12 alternate with position in a lateral direction transverse to the longitudinal axes 18. In an embodiment, the width dimension of the gaps 20 may be uniform. In an embodiment, the width dimension of the gaps 20 may be non-uniform. In an embodiment, the segments 16 may have a uniform pitch and a uniform line width. Alternatively, the pitch and/or line width of the segments 16 may be non-uniform. In an embodiment, the segments 16 may have equal or substantially equal lengths.

Figure 2:
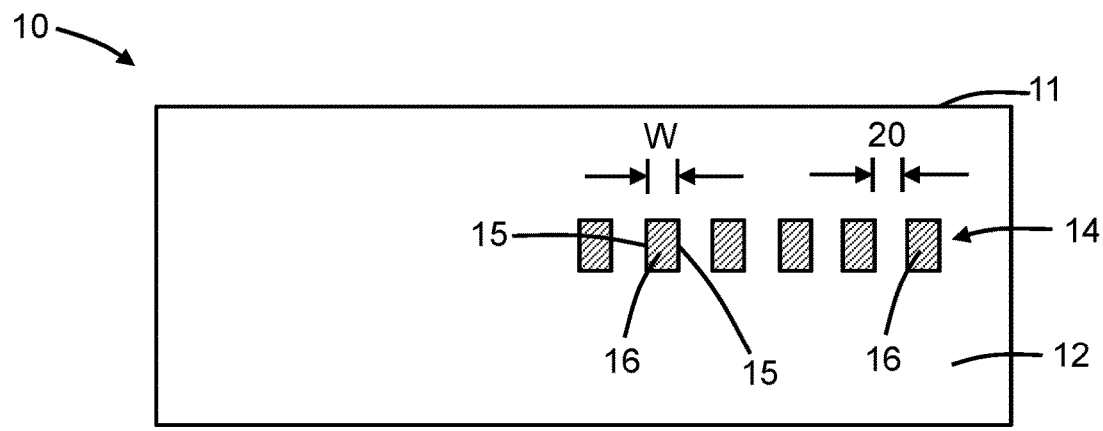
FIG. 2 is a cross-sectional view taken generally along line 2-2 in FIG. 1.
Figure 3:
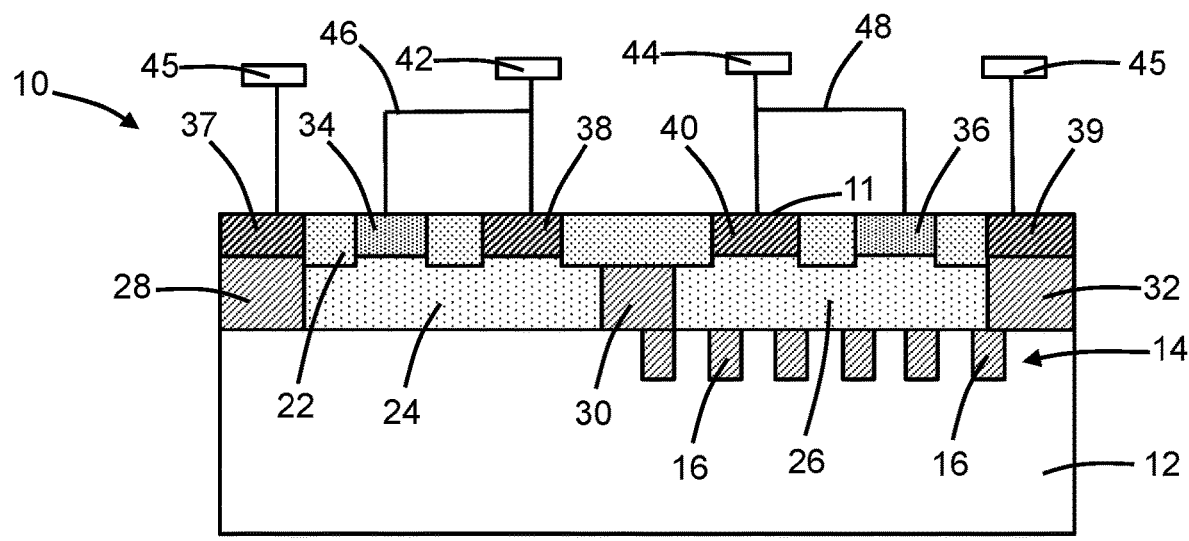
FIG. 3 is a cross-sectional view of the structure at a fabrication stage subsequent to FIG. 2.

With reference to FIG. 3 and at a fabrication stage subsequent to FIG. 2, shallow trench isolation regions 22 are formed in the semiconductor substrate 12. The shallow trench isolation regions 22 may be formed by patterning shallow trenches in the semiconductor substrate 12 with lithography and etching processes, depositing a dielectric material, such as silicon dioxide, to fill the shallow trenches, and planarizing and/or recessing the deposited dielectric material.

Wells 24, 26 are formed in the semiconductor substrate 12. The wells 24, 26 are doped to have an opposite conductivity type from the deep well 14. The wells 24, 26 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for implantation of ions to form the wells 24, 26. The implantation mask may include a layer of an organic photoresist that is applied and patterned to form openings exposing the selected areas on the top surface 11 of the semiconductor substrate 12 and determining, at least in part, the location and horizontal dimensions of the wells 24, 26. The implantation mask has a thickness and stopping power sufficient to block the implantation of ions in masked areas. The implantation conditions (e.g., ion species, dose, kinetic energy) may be selected to tune the electrical and physical characteristics of the wells 24, 26. In an embodiment, the wells 24, 26 may be doped with a concentration of a p-type dopant (e.g., boron) to provide p-type conductivity.

Wells 28, 30, 32 are formed in the semiconductor substrate 12. The wells 28, 30, 32 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for implantation of ions to form the wells 28, 30, 32. The implantation mask may include a layer of an organic photoresist that is applied and patterned to form openings exposing the selected areas on the top surface 11 of the semiconductor substrate 12 and determining, at least in part, the location and horizontal dimensions of the wells 28, 30, 32. The implantation mask has a thickness and stopping power sufficient to block the implantation of ions in masked areas. The implantation conditions (e.g., ion species, dose, kinetic energy) may be selected to tune the electrical and physical characteristics of the wells 28, 30, 32. In an embodiment, the wells 28, 30, 32 may be doped with a concentration of an n-type dopant (e.g., arsenic or phosphorus) to provide n-type conductivity.

The well 26 is positioned in a vertical direction between the deep well 14 and the top surface 11 of the semiconductor substrate 12. The segments 16 of the deep well 14 function to electrically isolate the well 26 from the semiconductor substrate 12. The well 26, which has an opposite conductivity type from the segments 16, may overlap with some of the segments 16. The wells 30, 32, which have the same conductivity type as the segments 16, may overlap with and adjoin segments 16 at the periphery of the deep well 14.

Doped regions 34, 36 are formed adjacent to the top surface 11 of the semiconductor substrate 12. The doped region 34 is positioned in the well 24 and the doped region 36 is positioned in the well 26. The doped regions 34, 36 are doped to have the same conductivity type as the wells 24, 26 but at a higher dopant concentration. The doped regions 34, 36 are accessible at the top surface 11 of the semiconductor substrate 12. In an embodiment, the doped regions 34, 36 may be doped (e.g., heavily doped) with a concentration of a p-type dopant (e.g., boron) to provide p-type conductivity. The doped regions 34, 36 may be concurrently formed by selectively implanting ions, such as ions including the p-type dopant, under given implantation conditions with an implantation mask having openings defining the intended locations for the doped regions 34, 36 in the semiconductor substrate 12.

Doped regions 37, 38, 39, 40 are formed adjacent to the top surface 11 of the semiconductor substrate 12. The doped region 38 is positioned in the well 24, and the doped region 40 is positioned in the well 26. The doped regions 38, 40 are doped to have an opposite conductivity type from the wells 24, 26. The doped region 37 is positioned in the well 28, and the doped region 39 is positioned in the well 30. The doped regions 37, 39 are doped to have the same conductivity type as the wells 28, 30 and may be respectively used to contact the wells 28, 30. In an embodiment, the doped regions 37, 38, 39, 40 may be doped (e.g., heavily doped) with a concentration of an n-type dopant (e.g., arsenic or phosphorus) to provide n-type conductivity. The doped regions 37, 38, 39, 40 may be concurrently formed by selectively implanting ions, such as ions including the n-type dopant, under given implantation conditions with an implantation mask having openings defining the intended locations for the doped regions 37, 38, 39, 40 in the semiconductor substrate 12.

Middle-of-line processing and back-end-of-line processing follow to form an interconnect structure with electrical connections coupled to the structure 10. The doped regions 34, 38 may be interconnected by an electrical connection 46 in the interconnect structure to define a terminal 42 of the structure 10, and the doped regions 36, 40 may be interconnected by an electrical connection 46 in the interconnect structure to define another terminal 44 of the structure 10. The doped region 37, 39 may be connected by electrical connections 45 in the interconnect structure to either ground or a bias voltage.

The structure 10 may embody a bidirectional device structure for a silicon-controlled rectifier that may be deployed in an integrated circuit as an electrostatic discharge protection device. The structure 10 may be used, for example, for either input/output pad protection or power pad protection. Current from an electrostatic discharge event may be received at the terminal 42 and shunted through the lateral silicon-controlled rectifier to the terminal 44. Alternatively, current from an electrostatic discharge event may be received at the terminal 44 and shunted through the lateral silicon-controlled rectifier to the terminal 42.

The segments 16 of the discontinuous deep well 14 electrically isolate the well 26 from the semiconductor substrate 12. The structure 10 with the segmented deep well 14 may exhibit similar performance as an electrostatic discharge protection device to a structure that includes a conventional continuous deep well. The segmented deep well 14, in comparison with a conventional continuous deep well, may be characterized by a reduced capacitance between the deep well 14 and the well 26 and a reduced capacitance between the deep well 14 and the semiconductor substrate 12, as well as a lowered harmonics distortion.

Figure 4:
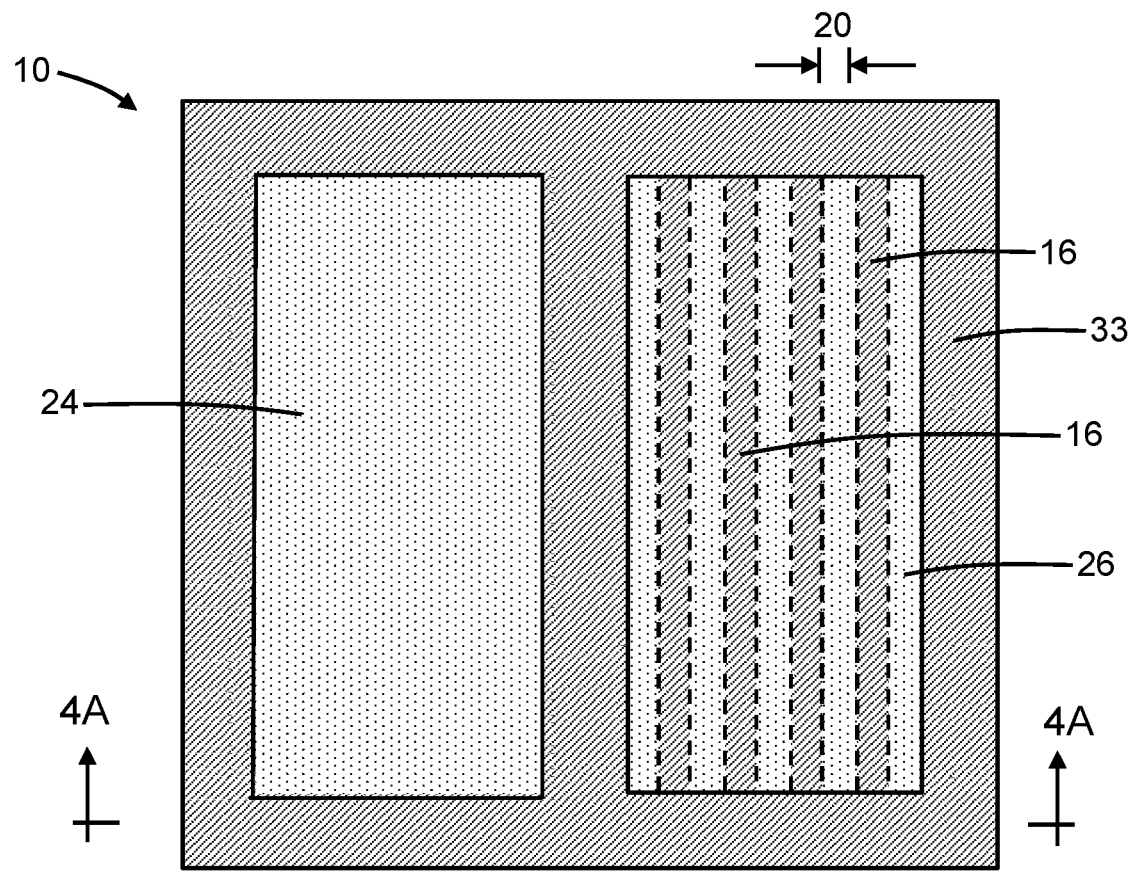
FIG. 4 is a top view of a structure in accordance with alternative embodiments of the invention.
Figure 4A:
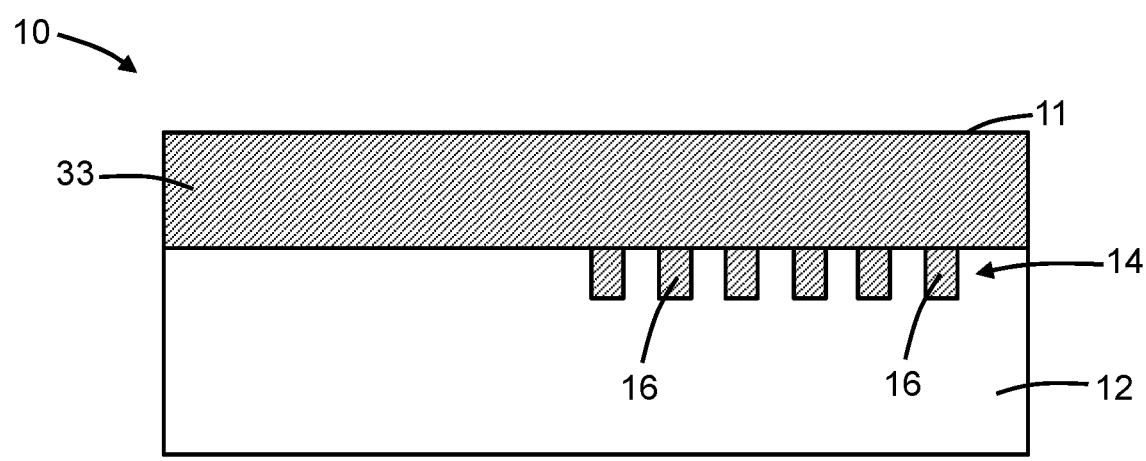
FIG. 4A is a cross-sectional view taken generally along line 4A-4A in FIG. 4.

With reference to FIGS. 4, 4A and in accordance with alternative embodiments of the invention, the wells 28, 30, 32 (FIG. 3) may be joined to define a continuous well 33 that may fully surround the well 26 on all sides, as well as separately surround the well 24 on all sides. The well 33 overlaps with at least a portion of each of the segments 16 of the deep well 14. Specifically, the well 33 may fully overlap with the peripheral segments 16, and the well 33 may overlap with opposite end portions of the non-peripheral segments 16. Processing continues to form the structure 10 as previously described.

Figure 5:
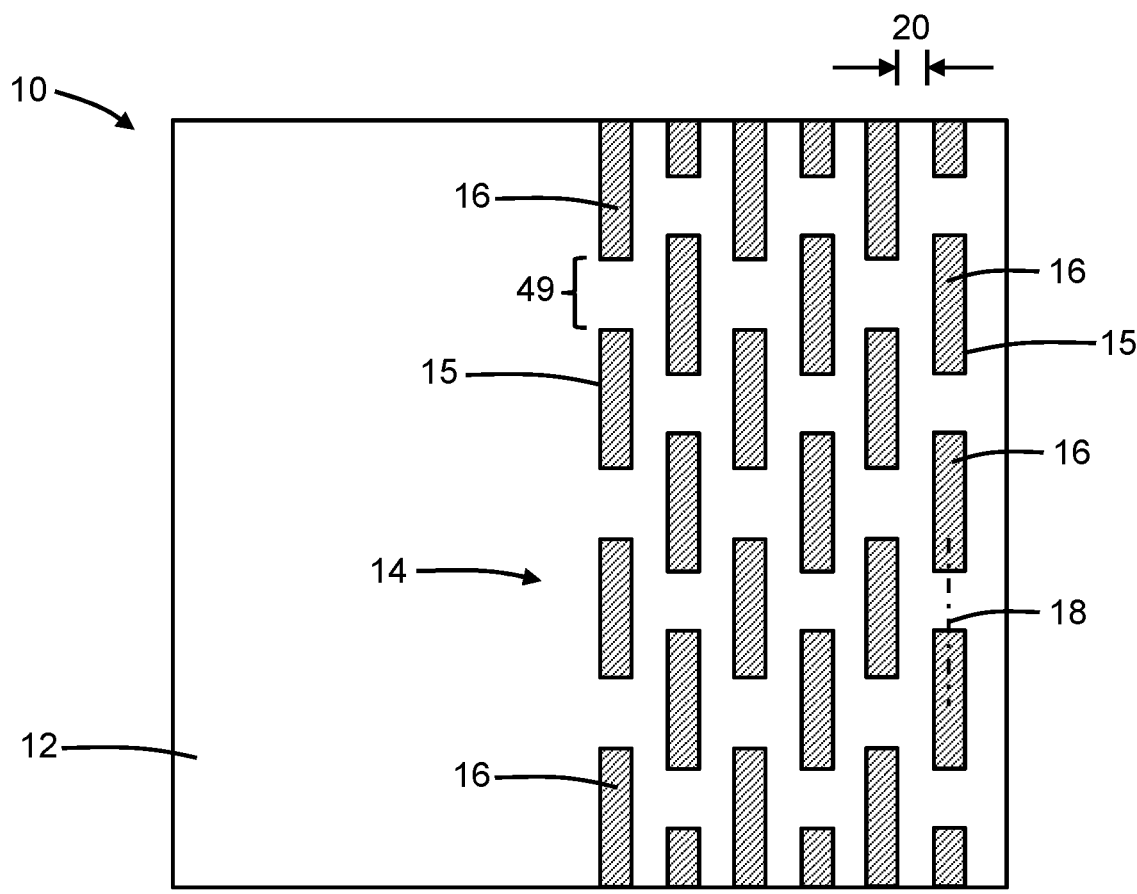
FIG. 5 is a top view of a structure in accordance with alternative embodiments of the invention.

With reference to FIG. 5 and in accordance with alternative embodiments of the invention, the segments 16 of the deep well 14 may be further segmented to have a shortened length, and the shortened segments 16 may be distributed in rows with the segments 16 in each separate row aligned along the respective longitudinal axis 18. In an embodiment, the rows of segments 16 may be arranged parallel to each other. The segments 16 in each row are longitudinally distributed with an end-to-end arrangement, in addition to a side-by-side arrangement segments 16 in adjacent rows. In an embodiment, the segments 16 in each row may be arranged with a constant pitch. Portions of the oppositely-doped semiconductor substrate 12 are positioned in the spaces 49 between the ends of adjacent segments 16 in each row, as well as in the gaps 20 between adjacent pairs of rows. In the representative embodiment, the segments 16 in adjacent pairs of rows are offset or staggered in longitudinal position. Processing continues to form the structure 10 as previously described.

Figure 6:
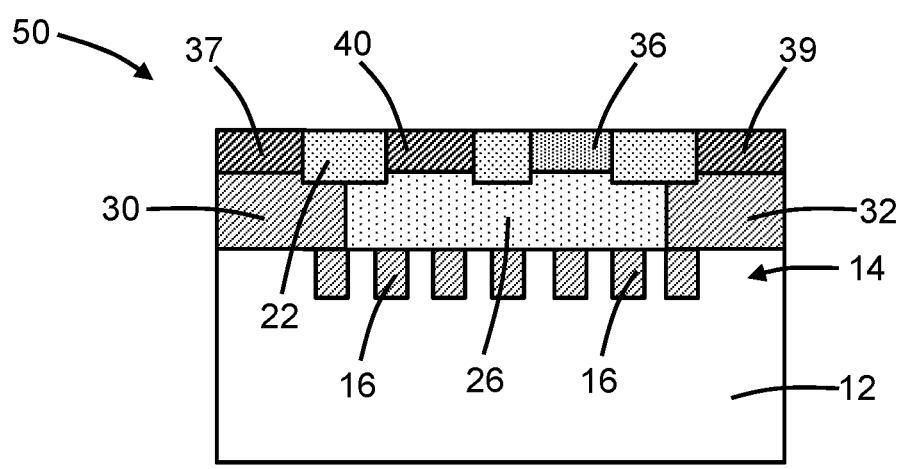
FIG. 6 is a cross-sectional view of a structure in accordance with alternative embodiments of the invention.

With reference to FIG. 6 and in accordance with alternative embodiments of the invention, the segmented deep well 14 may be used in conjunction with a structure 50 including a diode, which may be deployed as an electrostatic discharge protection device. The structure 50 includes the doped region 36 that may function as an anode of the diode and the doped region 40 that may function as a cathode of the diode. The segments 16 of the deep well 14 are positioned between the diode and the portion of the semiconductor substrate 12 beneath the deep well 14.

Figure 7:
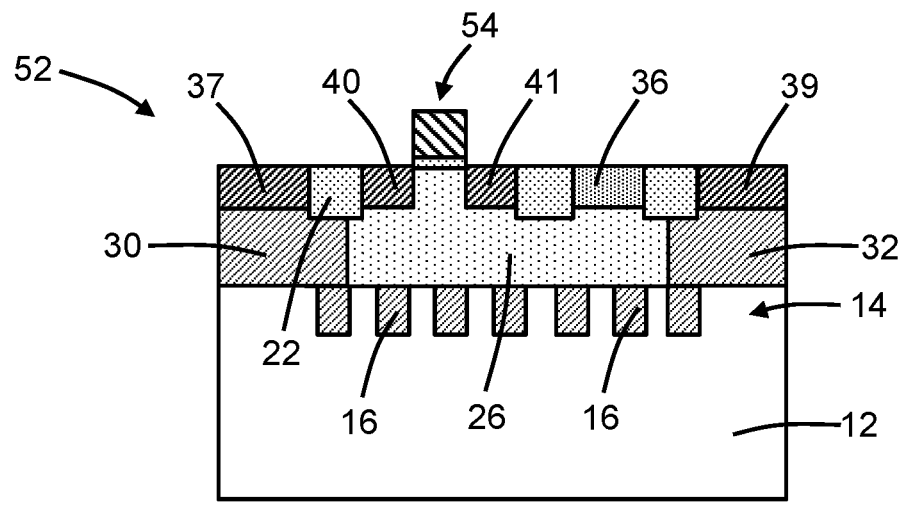
FIG. 7 is a cross-sectional view of a structure in accordance with alternative embodiments of the invention.

With reference to FIG. 7 and in accordance with alternative embodiments of the invention, the segmented deep well 14 may be used in conjunction with a structure 52 including a field-effect transistor, which may be deployed as an electrostatic discharge protection device. The structure 52 may include a doped region 41 that is similar or identical to doped region 40 and that is also located in the well 26. The doped regions 40, 41 may function as the source and drain of the field-effect transistor, which further includes a gate structure 54 arranged over a portion of the well 26 between the doped region 40 and the doped region 41. The gate structure 54 may include a gate electrode and a gate dielectric layer formed on the semiconductor substrate 12 by depositing a layer stack and patterning the layer stack with photolithography and etching processes. The gate electrode of the gate structure 54 may be comprised of a conductor, such as doped polycrystalline silicon (i.e., polysilicon) or a work function metal, and the gate dielectric layer of the gate structure 54 may be comprised of an electrical insulator, such as silicon dioxide or hafnium oxide. The doped region 36 may provide a well contact that is coupled to the well 26. The segments 16 of the deep well 14 are positioned between the field-effect transistor and the portion of the semiconductor substrate 12 beneath the deep well 14.

Figure 8:
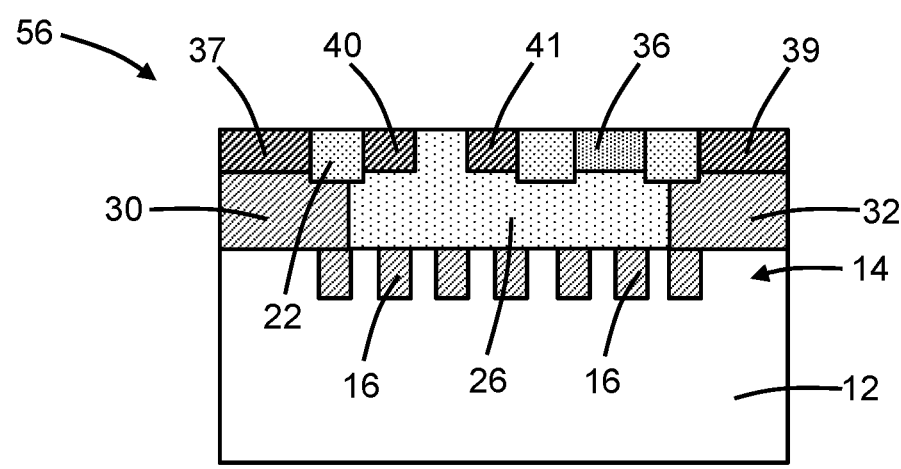
FIG. 8 is a cross-sectional view of a structure in accordance with alternative embodiments of the invention.

With reference to FIG. 8 and in accordance with alternative embodiments of the invention, the segmented deep well 14 may be used in conjunction with a structure 56 including a lateral bipolar junction transistor, which may be deployed as an electrostatic discharge protection device. The doped region 40 and doped region 41 function as the emitter and collector of the lateral bipolar junction transistor, the well 26 functions as the base of the lateral bipolar junction transistor, and the doped region 36 functions as an extrinsic base of the lateral bipolar junction transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor substrate having a top surface;
    a first well of a first conductivity type in the semiconductor substrate, the first well including a plurality of segments;
    a second well of a second conductivity type in the semiconductor substrate, the second conductivity type different from the first conductivity type, the second well positioned in a vertical direction between the segments of the first well and the top surface of the semiconductor substrate, and the second well overlapping with the segments;
    a third well of the first conductivity type in the semiconductor substrate, the third well positioned in a lateral direction adjacent to the second well; and
    a fourth well of the first conductivity type in the semiconductor substrate, the fourth well positioned in the lateral direction adjacent to the second well,
    wherein the second well is positioned in the lateral direction between the third well and the fourth well.

2. The structure of claim 1 wherein the segments comprise a plurality of strips positioned with a spaced arrangement in the lateral direction.

3. The structure of claim 2 wherein each adjacent pair of the segments is separated in the lateral direction by a strip of the semiconductor substrate.

4. The structure of claim 2 wherein the segments are arranged parallel to each other.

5. The structure of claim 1 wherein the segments are longitudinally distributed with an end-to-end arrangement in a plurality of rows.

6. The structure of claim 5 wherein adjacent pairs of the rows are arranged parallel to each other.

7. The structure of claim 5 wherein each row is aligned along a longitudinal axis, and the segments in each row are separated in a longitudinal direction by a portion of the semiconductor substrate.

8. The structure of claim 5 wherein the segments in adjacent pairs of the rows are staggered in longitudinal position.

9. The structure of claim 1 further comprising:
    a silicon-controlled-rectifier including a first doped region of the first conductivity type in the second well and a second doped region of the second conductivity type in the second well.

10. The structure of claim 1 further comprising:
    a diode including a first doped region of the first conductivity type in the second well and a second doped region of the second conductivity type in the second well.

11. The structure of claim 1 further comprising:
    a field-effect transistor including a first doped region of the first conductivity type in the second well and a second doped region of the first conductivity type in the second well.

12. The structure of claim 1 further comprising:
    a lateral bipolar junction transistor including a first doped region of the first conductivity type in the second well and a second doped region of the first conductivity type in the second well.

13. A method comprising:
    forming a first well of a first conductivity type in a semiconductor substrate, wherein the first well includes a plurality of segments;
    forming a second well of a second conductivity type in the semiconductor substrate, wherein the second conductivity type is opposite to the first conductivity type, the second well is positioned in a vertical direction between the segments of the first well and a top surface of the semiconductor substrate, and the second well overlaps with the segments
    forming a third well of the first conductivity type in the semiconductor substrate, wherein the third well is positioned in a lateral direction adjacent to the second well; and
    forming a fourth well of the first conductivity type in the semiconductor substrate,
    wherein the fourth well is positioned in the lateral direction adjacent to the second well, and the second well is positioned in the lateral direction between the third well and the fourth well.

14. The method of claim 13 further comprising:
    forming a silicon-controlled-rectifier including a first doped region of the first conductivity type in the second well and a second doped region of the second conductivity type in the second well.

15. The method of claim 13 wherein the segments comprise a plurality of strips positioned with a spaced arrangement in the lateral direction, and each adjacent pair of the segments is separated in the lateral direction by a strip of the semiconductor substrate.

* * * * *